United States Patent
Ono et al.

(10) Patent No.: US 8,654,991 B2
(45) Date of Patent: Feb. 18, 2014

(54) AUDIO SIGNAL AMPLIFIER CIRCUIT

(75) Inventors: Katsuyuki Ono, Kyoto (JP); Akinobu Kawamura, Kyoto (JP)

(73) Assignee: Rohm Co., Ltd. (JP)

( * ) Notice: Subject to any disclaimer, the term of this patent is extended or adjusted under 35 U.S.C. 154(b) by 706 days.

(21) Appl. No.: 12/795,158

(22) Filed: Jun. 7, 2010

(65) Prior Publication Data

US 2011/0158435 A1  Jun. 30, 2011

(30) Foreign Application Priority Data

Jun. 5, 2009 (JP) ................... 2009-136562
Aug. 21, 2009 (JP) ................... 2009-191685
Dec. 3, 2009 (JP) ................... 2009-275358
Mar. 30, 2010 (JP) ................... 2010-078285

(51) Int. Cl.
*H04B 15/00* (2006.01)
*H03F 99/00* (2009.01)
*H03F 1/26* (2006.01)

(52) U.S. Cl.
USPC ............... 381/94.5; 381/120; 330/149

(58) Field of Classification Search
USPC ............... 381/94.5, 120, 121; 330/149
See application file for complete search history.

(56) References Cited

U.S. PATENT DOCUMENTS

| | | | |
|---|---|---|---|
| 7,605,638 B2 * | 10/2009 | Nagasawa et al. | 327/536 |
| 2003/0206059 A1 * | 11/2003 | Suzuki | 330/252 |
| 2009/0196435 A1 * | 8/2009 | Miao | 381/94.5 |
| 2012/0281857 A1 * | 11/2012 | Huang | 381/94.5 |

FOREIGN PATENT DOCUMENTS

| | | |
|---|---|---|
| JP | 60-48605 A | 3/1985 |
| JP | 60-85608 A | 5/1985 |
| JP | 3-104407 A | 5/1991 |
| JP | 8-237051 A | 9/1996 |
| JP | 2002-185272 A | 6/2002 |
| JP | 2006-332994 A | 12/2006 |

OTHER PUBLICATIONS

Notification of Reason(s) for Refusal for Japanese Patent Application No. 2010-078285, dispatched Sep. 17, 2013, with English translation.

* cited by examiner

*Primary Examiner* — Ping Lee
(74) *Attorney, Agent, or Firm* — Cantor Colburn LLP

(57) ABSTRACT

An inverting amplifier which drives headphones via an output capacitor includes: an operational amplifier, an input resistor having a first terminal via which an audio signal to be amplified is received, and a second terminal connected to an inverting input terminal of the operational amplifier; and a feedback resistor having a first terminal connected to an inverting input terminal of the operational amplifier, and a second terminal connected to the output terminal. A reference voltage source generates a bias voltage Vb, and supplies it to the non-inverting input terminal. A discharging path includes a discharging resistor and a first switch arranged in series between an output terminal of the reference voltage source and an fixed voltage terminal. A second switch is arranged between the output terminal of the operational amplifier and a node on the discharging path where the electric potential is higher than it is at the discharging resistor.

11 Claims, 10 Drawing Sheets

AUDIO SIGNAL AMPLIFIER CIRCUIT

BACKGROUND OF THE INVENTION

1. Field of the Invention

The present invention relates to an audio signal amplifier circuit.

2. Description of the Related Art

Audio devices or electronic devices having an audio playback function include an audio signal amplifier circuit configured to amplify a weak electrical signal, and to output the electrical signal thus amplified to an electroacoustic transducer such as speakers, headphones, earphones, or the like (which will be collectively referred to as "speakers" hereafter).

In some cases, a coupling capacitor is arranged between the audio signal amplifier circuit and the speaker in order to prevent a DC current from flowing from the audio signal amplifier circuit to the speakers. With an arrangement which allows the user to detachably connect headphones or earphones to the device, if the user removes and inserts the headphones during audio playback, unexpected charging or discharging occurs at the coupling capacitor, and in some cases this current leads to an audible noise being output from the headphones. In order to avoid this problem, in some conventional arrangements, a discharging resistor is arranged on a path provided in parallel with the electroacoustic transducer. Such an arrangement including such a discharging resistor provides a charging/discharging path for the coupling capacitor regardless of whether the headphones are inserted or removed, thereby suppressing the occurrence of noise.

RELATED ART DOCUMENTS

Patent Documents

[patent document 1]
   Japanese Patent Application Laid Open No. S60-085608
[patent document 2]
   Japanese Patent Application Laid Open No. 2002-185272
[patent document 3]
   Japanese Patent Application Laid Open No. H03-104407
[patent document 4]
   Japanese Patent Application Laid Open No. H08-237051

Problem 1. Let us consider an arrangement in which the speakers are driven by means of an inverting amplifier having a configuration including an operational amplifier, an input resistor, and a feedback resistor. The operational amplifier is arranged such that a reference bias voltage is received via a non-inverting input terminal thereof, an input signal to be amplified is input to an inverting input terminal via the input resistor, and an amplified output signal is fed back via the feedback resistor.

Whenever a voltage difference arises between the voltage at the non-inverting input terminal of the operational amplifier and the voltage at the output terminal thereof when the inverting amplifier is switched from the OFF state to the ON state, there is a problem in that noise occurs according to this difference.

Problem 2. Operational amplifiers are widely used for various purposes as a basic circuit component in the configuration of electronic circuits. In many cases, an amplifier configured to amplify an audio signal so as to drive speakers or headphones is configured as an inverting amplifier or a non-inverting amplifier employing an operational amplifier (differential amplifier), for example.

FIGS. 6A and 6B are circuit diagram and a time chart which show the configuration of a typical inverting amplifier and the operation thereof, respectively. An audio amplifier 201 includes an operational amplifier 202, an input resistor Ri, a feedback resistor Rf, and a bias voltage source 204.

A bias voltage Vbias generated by the bias voltage source 204 is input to the non-inverting terminal of the operational amplifier 202. When an audio signal Vin is amplified, the bias voltage Vbias is set to on the order of ½ the power supply voltage Vdd. The audio signal Vin is input to the inverting input terminal of the operational amplifier 202 via the input capacitor Ci and the input resistor Ri. The feedback resistor Rf is arranged between the output terminal of the operational amplifier 202 and the inverting input terminal thereof.

The DC component of the input voltage Vin is removed by means of the input capacitor Ci, thereby extracting the AC signal component Vin'. The AC signal component Vin' is amplified with a gain of $-(Rf/Ri)$, and the AC signal component Vin' thus amplified is superimposed on the DC bias voltage Vbias. That is to say, the following relation is satisfied between the output voltage Vout and the signal component Vin' of the input voltage.

$$Vout = -(Rf/Ri) \times Vin' + Vbias \quad (1)$$

Description will be made regarding the operation when the audio amplifier 201 is started up from the shutdown state. In the shutdown state, the power supply voltage Vdd is set to 0 V, and the bias voltage Vbias is also set to 0 V. When the power supply is turned on, the bias voltage source 204 gradually raises the bias voltage Vbias over time, from 0 V up to the target value Vbmax.

In a case in which there is a desire to operate the audio amplifier 201 with a low power supply voltage Vdd, i.e., in a range of on the order of 0.9 V, in many cases, where a semiconductor process is employed in which Vthn<Vthp, the differential pair of the input stage of the operational amplifier 202 is configured employing N-channel MOSFETs (Metal Oxide Semiconductor Field Effect Transistors). Here, Vthn represents the threshold voltage of an N-channel MOSFET, and Vthp represents the threshold voltage of a P-channel MOSFET.

However, in a case in which the input differential pair is configured using N-channel MOSFETs, the operational amplifier 202 does not operate normally in a range where Vb<Vthn. That is to say, Expression (1) does not hold true. Specifically, Vout does not have a linear relation with Vbias. Accordingly, the output voltage rapidly rises in the start-up time of the audio amplifier 201 even if the bias voltage Vbias is raised with time, leading to a problem of occurrence of noise.

In order to solve the aforementioned problem, a method is effectively employed using a rail-to-rail amplifier including an input differential pair formed of N-channel MOSFETs and an input differential pair formed of P-channel MOSFETs. However, such an arrangement employing the rail-to-rail amplifier has a problem of an increased circuit area and/or a problem of increased current consumption.

Also, similar problems can occur in different circuits other than the audio amplifier.

SUMMARY OF THE INVENTION

1. An embodiment of the present invention has been made in order to solve the aforementioned problem 2, and accordingly, it is an exemplary purpose thereof to provide a technique for suppressing noise in an audio signal amplifier circuit.

An embodiment of the present invention relates to an audio signal amplifier circuit. The audio signal amplifier circuit comprises: an inverting amplifier configured to drive an electroacoustic transducer via a coupling capacitor; a reference voltage source; a discharging path; and a second switch. The inverting amplifier includes: an operational amplifier; an input resistor arranged such that an audio signal to be amplified is received via the first terminal thereof, and such that the second terminal thereof is connected to the inverting input terminal of the operational amplifier; and a feedback resistor arranged such that the first terminal thereof is connected to the inverting input terminal of the operational amplifier, and such that the second terminal thereof is connected to the output terminal of the operational amplifier. The reference voltage source generates a bias voltage, and supplies the bias voltage thus generated to the non-inverting input terminal of the operational amplifier. The discharging path includes a discharging resistor and a first switch arranged in series between the output terminal of the reference voltage source and a fixed voltage terminal. The second switch is arranged between the output terminal of the operational amplifier and a node on the discharging path at which the electric potential is higher than it is at the discharging resistor.

With such an embodiment, the first switch and the second switch are turned on when the inverting amplifier is set to the OFF state. Thus, such an arrangement ensures that the electric potential at the output terminal of the operational amplifier is approximately the same as it is at the non-inverting input terminal thereof. Thus, there is almost no difference in the electric potential between the output terminal of the operational amplifier and the non-inverting input terminal thereof at a timing at which the inverting amplifier is turned on again. Thus, such an arrangement is capable of suppressing noise occurrence.

Also, the first switch may be arranged at a position at which the electric potential is lower than it is at the discharging resistor. Also, the second switch may be arranged between the output terminal of the operational amplifier and the output terminal of the reference voltage source.

With such an arrangement in which the first switch is configured as an N-channel MOSFET (Metal Oxide Semiconductor Field Effect Transistor) or an NPN bipolar transistor, a control signal (gate voltage or base voltage) can be supplied to the control terminal (gate or base) thereof with a fixed voltage (ground voltage) as a reference voltage. Thus, such an arrangement provides a simple circuit configuration.

Also, an audio signal amplifier circuit according to an embodiment may comprise: multiple inverting amplifiers, respectively provided to multiple channels; and multiple second switches, respectively provided to the multiple channels. Also, the second switch provided to each channel may be arranged between the output terminal of the operational amplifier provided to the corresponding channel and a node on the discharging path at which the electric potential is higher than it is at the discharging resistor.

With such an arrangement, the voltage level applied to the electroacoustic transducer can be adjusted to be the same level among the multiple channels. Even if noise occurs, such an arrangement is capable of adjusting the volume to be the same level among the multiple channels.

Also, the first switch may be arranged at a position at which the electric potential is lower than it is at the discharging resistor. Also, the second switch provided to each channel may be arranged between the output terminal of the operational amplifier provided to the corresponding channel and the output terminal of the reference voltage source.

Also, the operational amplifier, the first switch, the second switch, and the discharging resistor may be monolithically integrated on a single semiconductor substrate. Examples of "arrangements monolithically integrated" include: an arrangement in which all the elements of a circuit are formed on a single semiconductor substrate; and an arrangement in which principal elements of a circuit are monolithically integrated. Also, a part of the resistors, capacitors, and so forth, for adjusting circuit constants, may be provided as elements external of the semiconductor substrate. By monolithically integrating the amplifier circuit in the form of a single IC (integrated circuit), such an arrangement provides a reduced circuit area.

2. Another embodiment of the present invention has been made in order to solve the aforementioned problem 2. Accordingly, it is an exemplary purpose thereof to provide an non-inverting amplifier having improved linearity in the start-up stage.

Another embodiment of the present invention relates to an inverting amplifier configured to inverting-amplify an input signal. The inverting amplifier comprises: an operational amplifier which comprises a first input differential pair including first conduction-type MOSFETs (Metal Oxide Semiconductor Field Effect Transistors) and a second input differential pair including second conduction-type MOSFETs; an input resistor arranged such that one terminal thereof is connected to an inverting input terminal of the operational amplifier, and an input signal to be amplified is received via the other terminal thereof; a feedback resistor arranged between the inverting input terminal of the operational amplifier and an output terminal thereof; a bias voltage source configured to generate a bias voltage, and to supply the bias voltage thus generated to a non-inverting input terminal of the operational amplifier; and a control unit configured to switch the second input differential pair between an active state and an inactive state.

When the second input differential pair is set to the active state, the operational amplifier substantially operates as a rail-to-rail amplifier, thereby widening the input voltage range. When the second input differential pair is set to the inactive state, such an arrangement reduces current consumption by the circuit.

Also, an arrangement may be made in which, when a voltage that corresponds to the bias voltage is lower than a predetermined threshold value, the control unit sets the second input differential pair to the active state, and when the voltage that corresponds to the bias voltage is higher than the threshold value, the control unit sets the second differential pair to the inactive state.

The "voltage B that corresponds to the voltage A" as used here refers to a voltage B having the same level as that of the voltage A, a voltage B which is proportional to the voltage A, a voltage B which changes with a delay that corresponds to the voltage A, and combinations thereof, in addition to a voltage B which is the voltage A itself.

Also, the control unit may set the second input differential pair to the active state before a predetermined period of time elapses after the start-up operation of the inverting amplifier is started (power supply is turned on). After the predetermined period of time elapses, the control unit may set the second input differential pair to the inactive state.

Also, the control unit may switch the second input differential pair between the active state and the inactive state by controlling the supply of a tail current to the second input differential pair.

Also, the inverting amplifier may further comprise a cutoff transistor arranged on a path for the tail current to be supplied to the second input differential pair. Also, the control unit may be configured to switch the cutoff transistor between the ON state and the OFF state.

Also, the first input differential pair may be formed of N-channel MOSFETs. Also, the second conduction-type MOSFET may be configured as a P-channel MOSFET.

Also, the threshold voltage of the P-channel MOSFET may be greater than the threshold voltage of the N-channel MOSFET.

Also, the current capacity of the second input differential pair may be lower than the current capacity of the first input differential pair. Such an arrangement provides a reduced circuit area.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B. Similarly, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

[First Embodiment]

Figure 1:
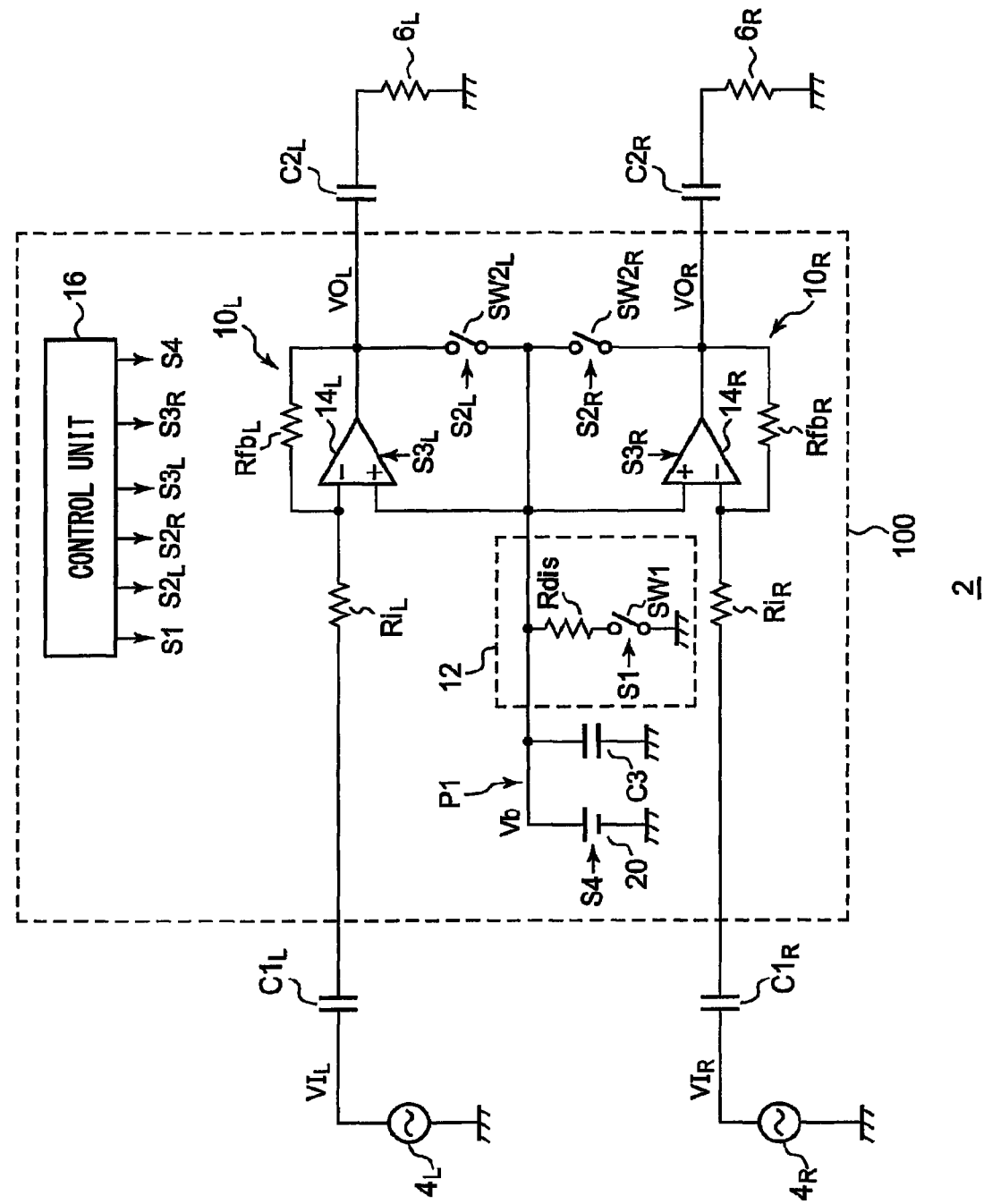
FIG. 1 is a block diagram which shows a configuration of an audio playback apparatus including an audio signal amplifier circuit according to a first embodiment.

FIG. 1 is a block diagram which shows a configuration of an audio playback apparatus 2 including an audio signal amplifier circuit (headphone amplifier) 100 according to a first embodiment. The audio playback apparatus 2 has a function of outputting an audio signal (voice signal), and is mounted on various electronic devices such as cellular phone terminals, portable audio players, headphone amplifiers, non-portable audio components, etc.

The audio playback apparatus 2 includes sound sources 4, input capacitors C1, output capacitors C2, an audio signal amplifier circuit 100, and headphones 6. The audio playback apparatus 2 shown in FIG. 1 has a two-channel stereo configuration. It should be noted that the present invention is not restricted to such an arrangement. Also, the audio playback apparatus 2 may have a monaural configuration or a multi-channel configuration having three or more channels. Note that, in order to distinguish between the two stereo channels, these two stereo channels will be denoted by the subscript letters "L" and "R". When there is no need to distinguish between these two stereo channels, the subscript letters will be omitted as appropriate.

The sound sources generate an L-channel audio signal VIL and an R-channel audio signal VIR, respectively. The audio signal amplifier circuit 100 receives the audio signals VIL and VIR via the input capacitor C1L and C1R. The audio signal amplifier circuit 100 amplifies the audio signals VIL and VIR, and outputs the audio signals VIL and VIR thus amplified to the headphones 6L and 6R.

Description will be made below regarding the configuration of the audio signal amplifier circuit 100.

The audio signal amplifier circuit 100 includes inverting amplifiers 10L and 10R provided to the respective channels, a reference voltage source 20, a capacitor C3, a discharging path 12, second switches SW2L and SW2R provided to the respective channels, and a control unit 16.

The inverting amplifiers 10L and 10R each have the same configuration. Each inverting amplifier 10 includes an operational amplifier 14, an input resistor Ri, and a feedback resistor Rfb. The audio signal VI to be amplified is input to the first terminal of the input resistor Ri, and the second terminal thereof is connected to the inverting input terminal (−) of the operational amplifier 14. The first terminal of the feedback resistor Rfb is connected to the inverting input terminal (−) of the operational amplifier 14, and the second terminal thereof is connected to the output terminal of the operational amplifier 14.

The inverting amplifier 10 inverting-amplifies the audio signal VI, which is input via the corresponding input capacitor C1, with a gain $g$ ($=-Rfb/Ri$) using the bias voltage Vb as a reference.

The reference voltage source 20 generates the bias voltage Vb, and supplies the bias voltage Vb thus generated to the non-inverting input terminal (+) of the operational amplifier 14. The output terminal P1 of the reference voltage source 20 is connected to the capacitor C3 in order to stabilize the bias voltage Vb.

The discharging circuit 12 includes a discharging resistor Rdis and a first switch SW1 arranged in series between the output terminal P1 of the reference voltage source 20 and the fixed voltage terminal (ground terminal).

The second switch SW2 is arranged between the output terminal of the operational amplifier 14 and a node on the discharging path 12 at which the electric potential is higher than it is at the discharging resistor Rdis. Specifically, in FIG. 1, the first switch SW1 is arranged at a position at which the electric potential is lower than it is at the discharging resistor Rdis. In this case, the second switch SW2 is arranged between the output terminal of the corresponding operational amplifier 14 and the output terminal P1 of the reference voltage source 20.

The first switch SW1 can be configured as an N-channel MOSFET (Metal Oxide Semiconductor Field Effect Transistor) or an NPN bipolar transistor. With such an arrangement in which the first switch SW1 is arranged at a position at which the electric potential is lower than it is at the discharging resistor Rdis, a fixed voltage (ground voltage) should be applied to the control terminal (gate or base) of the first switch SW1 when the first switch SW1 is to be OFF, and a high-level signal should be applied to the control terminal with the ground voltage as a reference when the first switch SW1 is to be ON. Thus, such an arrangement provides a simple circuit configuration.

The control unit 16 generates control signals S1 through S4 which are used to control the ON/OFF states of the first switch SW1, the second switches SW2L and SW2R, the operational amplifiers 14L and 14R, and the reference voltage source 20. The control signal Si is input to the first switch SW1. The control signals S2L and S2R are input to the second switches SW2L and SW2R, respectively. The control signals S3L and S3R are input to the third switches SW3L and SW3R, respectively. The control signal S3 is input to the reference voltage source 20. In the following description, the high-level state (asserted state) of each control signal is taken as corresponding to the ON state of the corresponding component.

The operational amplifiers 14L and 14R provided to the respective channels, the first switch SW1, the discharging resistor Rdis, the second switches SW2L and SW2R, and the control unit 16 are integrated on a single semiconductor substrate. By providing the input resistors Ri and the feedback resistors Rfb in the form of external components, such an arrangement allows the gain of the inverting amplifier 10 to be changed by changing the circuit constants of the input resistors Ri and the feedback resistors Rfb.

It should be noted that the input resistors Ri and the feedback resistors Rfb may be monolithically integrated together with the operational amplifier 14 and so forth. Such an arrangement provides an advantage of a semiconductor package having a reduced number of terminals.

The above is the configuration of the audio signal amplifier circuit 100. Next, description will be made regarding the operation thereof.

Figure 2:
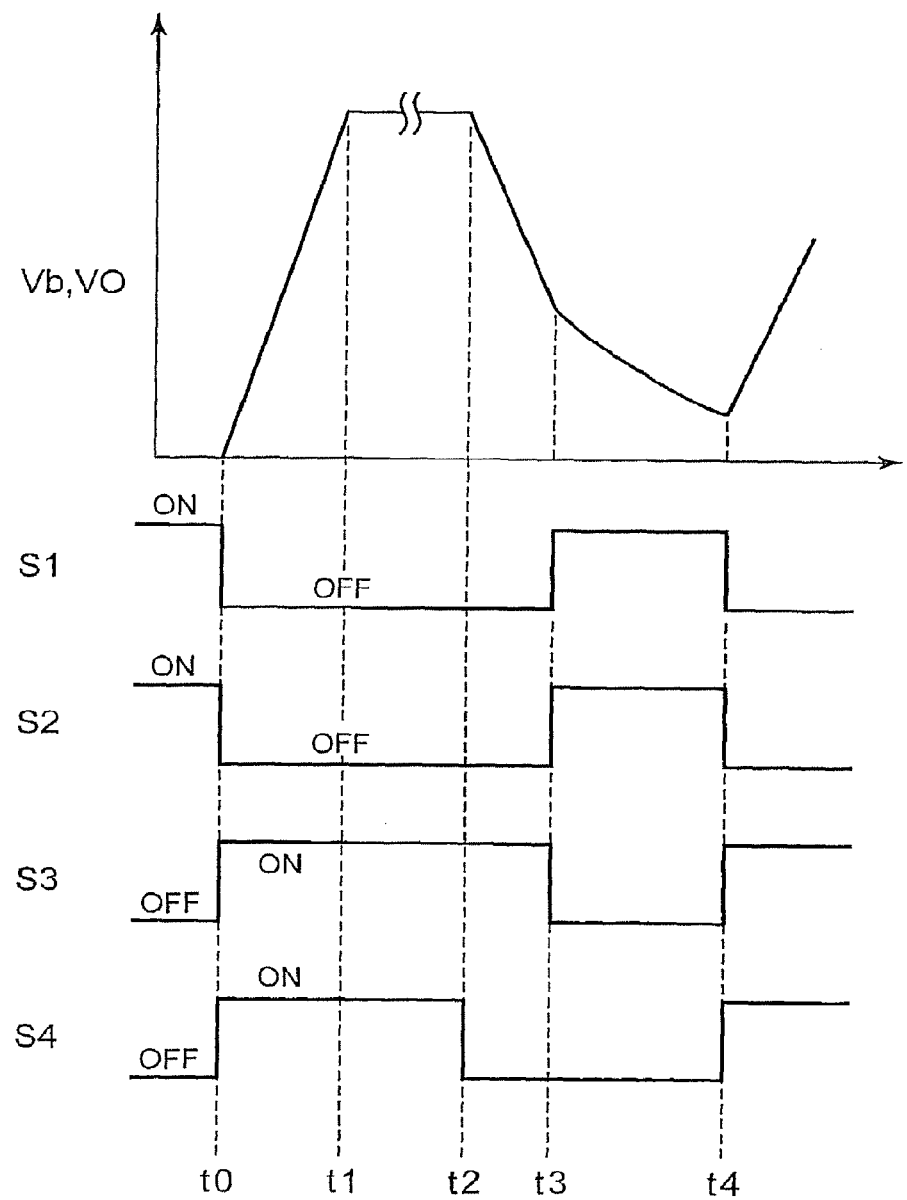
FIG. 2 is a time chart which shows the operation of the audio signal amplifier circuit shown in FIG. 1.

FIG. 2 is a time chart which shows the operation of the audio signal amplifier circuit 100 shown in FIG. 1. The upper graph represents the bias voltage Vb and the DC components of the output voltages VOL and VOR of the operational amplifiers 14L and 14R.

At the time point t0, an instruction is given to start up the audio signal amplifier circuit 100. Upon receiving this instruction, the control unit 16 switches the control signals S1 and S4 to the high-level state, thereby turning on the reference voltage source 20. Furthermore, the control unit 16 switches the control signals S1 and S2 to the low-level state, thereby turning off the first switch SW1 and the second switch SW2.

After the time point t0, the capacitor C3 is charged by the reference voltage source 20, and accordingly, the bias voltage Vb rises over time, toward the target value. The output voltages VOL and VOR of the operational amplifiers 14L and 14R each rise according to the bias voltage Vb.

The period between the time points t1 and t2 during which the bias voltage Vb matches the target value is used as a playback period. In this period, the input audio signals VIL and VIR are amplified.

At the time point t2, an instruction is given to stop the playback operation. Upon receiving this instruction, the control unit 16 instructs the reference voltage source 20 to lower the bias voltage Vb. During the period between the time points t2 and t3, the bias voltage Vb is lowered to on the order of 20% of the target value. During this period, the operational amplifiers 14L and 14R are each in the ON state. Accordingly, the output voltages VOL and VOR of the operational amplifiers 14L and 14R are each lowered according to the bias voltage Vb.

At the time point t3, the control unit 16 turns off the reference voltage source 20 and turns on the first switch SW1 and the second switch SW2. When the first switch SW1 is ON, the capacitor C3 is discharged via the discharging resistor Rdis and the first switch SW1, and accordingly, the bias voltage Vb is lowered toward the ground voltage (0 V). The output capacitors C2L and C2R are discharged via the second switches SW2L and SW2R, the discharging resistor Rdis, and the first switch SW1, and accordingly, the electric potentials at the output capacitors C2L and C2R are lowered to the ground voltage. During this period, the electric potentials of the output voltages VOL and VOR substantially match the bias voltage Vb at one terminal of the capacitor C3.

At the time point t4, an instruction is given to start up the audio signal amplifier circuit 100 again. Upon receiving this instruction, the reference voltage source 20 turns off the first switch SW1 and the second switch SW2, and the reference voltage source 20 and the operational amplifier 14 are turned on. The subsequent operation is performed in the same way as described above.

With such an embodiment, in the shutdown sequence series after the time point t2, the electric potential at the non-inverting input terminal (+) of the operational amplifier 14 substantially matches the electric potential VO of the output terminal. Accordingly, the electric potential at the non-inverting input terminal of the operational amplifier 14 matches the electric potential at the output terminal thereof when the audio signal amplifier circuit 100 is started up again. Thus, such an arrangement provides an advantage of generating substantially no noise or an exceedingly small amount of noise.

Figure 3:
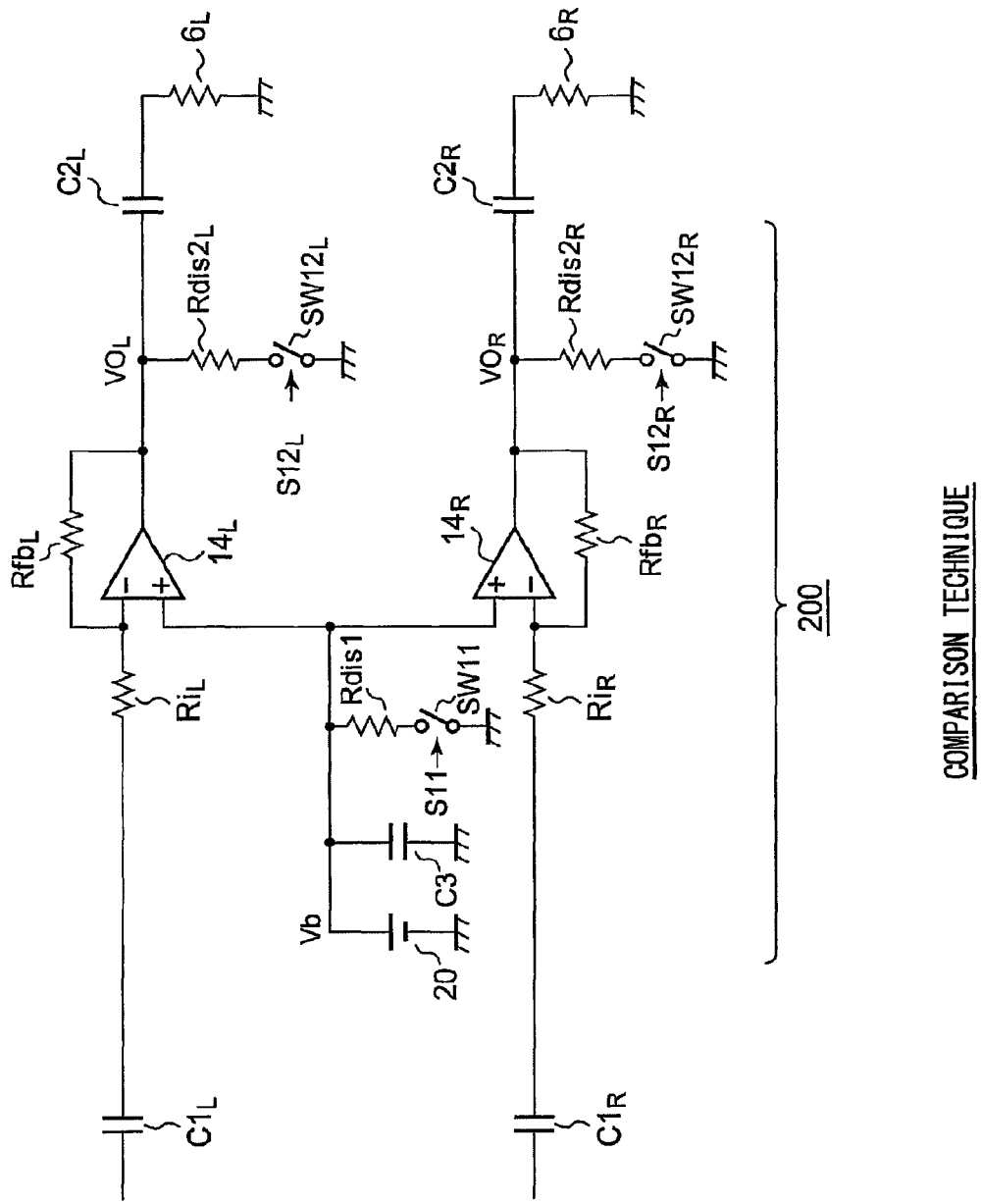
FIG. 3 is a circuit diagram which shows a configuration of an audio signal amplifier circuit according to a comparison technique.
Figure 4:
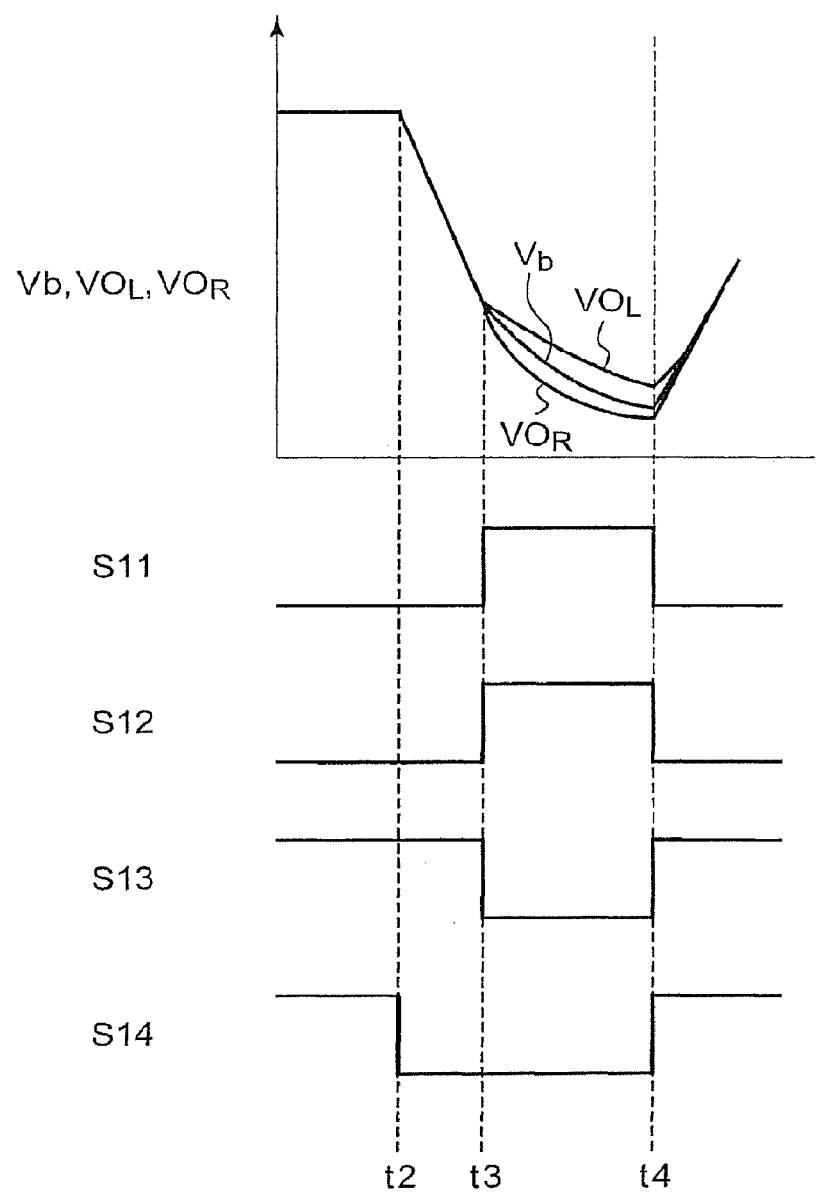
FIG. 4 is a time chart which shows a shutdown sequence for the audio signal amplifier circuit shown in FIG. 3.

This effect can be more clearly understood in comparison with the following conventional technique shown in FIG. 3. FIG. 3 is a circuit diagram which shows a configuration of an audio signal amplifier circuit 200 according to a comparison technique. In FIG. 3, the discharging path (Rdis2 and SW12) for the output terminal of the operational amplifier 14 and the discharging path (Rdis1 and SW11) for the non-inverting input terminal (+) thereof are independent. FIG. 4 is a time chart which shows the shutdown sequence of the audio signal amplifier circuit 200 shown in FIG. 3.

At the time point t2, an instruction is given to stop the playback operation. Upon receiving this instruction, an control unit (not shown) instructs the reference voltage source 20 to lower the bias voltage Vb. During the period between the time points t2 and t3, the bias voltage Vb is reduced to around 20% of the target value. The output voltages VOL and VOR are also reduced according to the bias voltage Vb.

At the time point t3, the control unit 16 turns off the reference voltage source 20, and turns on a first switch SW11 and a second switch SW12. When the first switch SW11 is ON, the capacitor C3 is discharged via the discharging resistor Rdis1 and the first switch SW11, and accordingly, the bias voltage Vb is lowered toward the ground voltage (0 V). The output capacitor C2L is discharged via a second switch SW12L and a discharging resistor Rdis2L. The output capacitor C2R is discharged via a second switch SW12R and a discharging resistor Rdis2R. Depending on the time constant of each discharging path, the discharging speeds of the capacitors C3, C2L, and C2R are different. Accordingly, differences can arise in the electric potentials of the voltages Vb, VOL, and VOR, as shown in the drawing.

At the time point t4, an instruction is given to start up the audio signal amplifier circuit 200 again. Upon receiving this instruction, the reference voltage source 20 turns off the first switch SW11 and the second switch SW12, and the reference voltage source 20 and the operational amplifier 14 are turned on.

With such a circuit shown in FIG. 3, at the timing of the time point t4, there is a difference in the electric potential (VO−Vb) between the output terminal and the non-inverting input terminal (+) of the operational amplifier 14. When the operational amplifier 14 is turned on at the time point t4, a charging current (or discharging current) flows through the output capacitor C2 so as to cancel out this difference in the electric potential, leading to noise being output from the headphones 6.

As described above, in such a comparison technique as shown in FIG. 3, noise is in danger of occurring when the state is returned from the stopped state to the playback state. In contrast, with the audio signal amplifier circuit 100 shown in FIG. 1, such noise can be suppressed.

Furthermore, with the audio signal amplifier circuit 200 shown in FIG. 3, the noise can occur at a different volume for each channel, which is undesirable in terms of the user's listening sensation comfort. In contrast, with the audio signal amplifier circuit 100 shown in FIG. 1, the output voltages VOL and VOR for the respective channels are substantially the same. Thus, even if noise occurs, the noise volume is the same for each channel. Thus, such an arrangement reduces the discomfort experienced by the user.

Furthermore, seen from a different point of view, it can be understood that, in contrast to the audio signal amplifier circuit 200 shown in FIG. 3, it is a feature of the audio signal amplifier circuit 100 shown in FIG. 1 that the output terminal P1 of the reference voltage source 20 and the output capacitors C2L and C2R are discharged via a common discharging resistor Rdis. By providing the common discharging resistor Rdis, such an arrangement is capable of providing the same CR constant for each discharging path, and provides an advantage of a reduced circuit area.

The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Figure 5A:
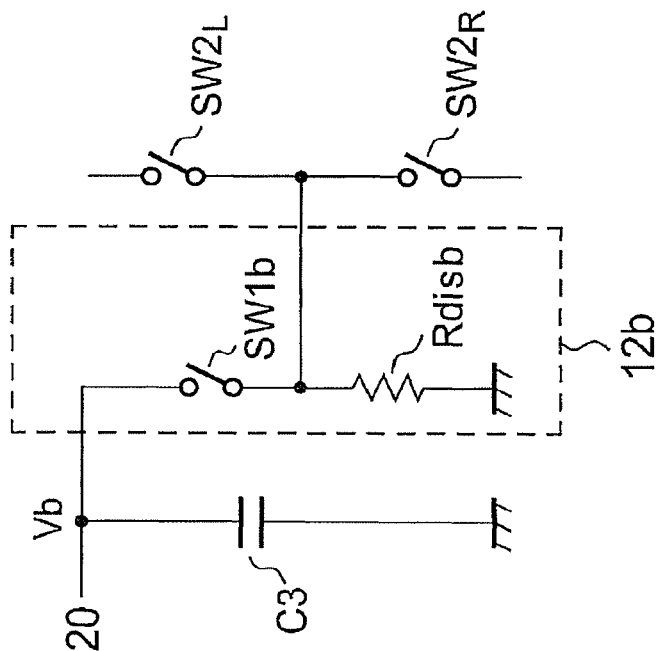
FIGS. 5A and 5B are circuit diagrams which each show a part of an audio signal amplifier according to a modification.
Figure 5B:
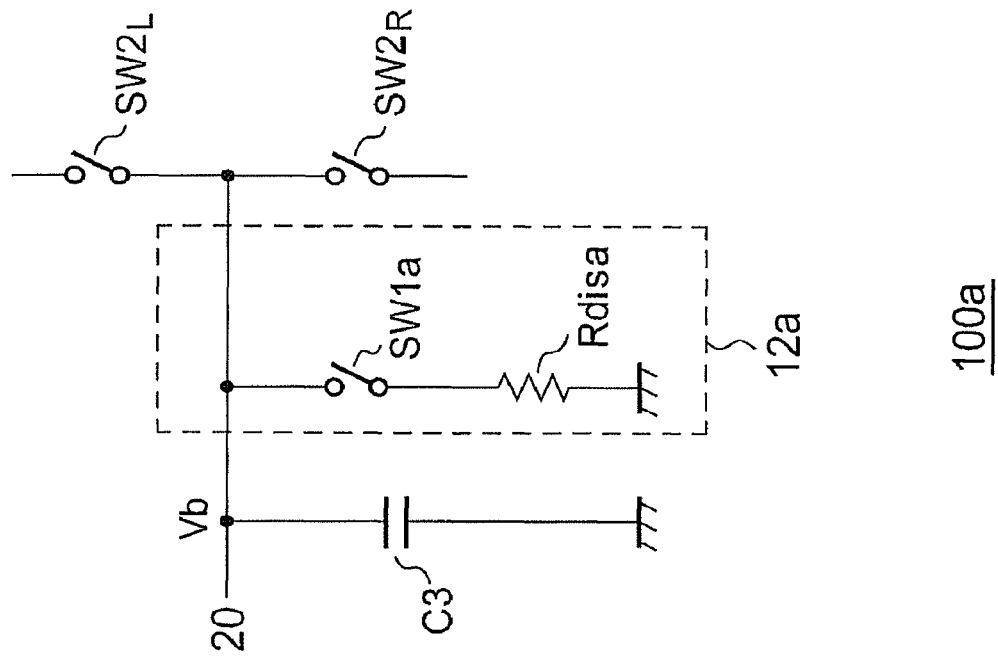

FIGS. 5A and 5B are circuit diagrams which each show a part of the configuration of an audio signal amplifier circuit 100 according to a modification.

In FIG. 5A, the first switch SW1a and the discharging resistor Rdisa, which form the discharging path 12a, are disposed in the reverse order of that shown in FIG. 1. That is to say, the discharging resistor Rdisa is arranged at a position at which the electric potential is lower than it is at the first switch SW1a. With such a modification, the capacitor C3 is discharged via the discharging path 12a, the output capacitor C2L is discharged via the second switch SW2L and the discharging path 12a, and the output capacitor C2R is discharged via the second switch SW2R and the discharging path 12a.

The discharging path 12b according to a modification shown in FIG. 5B has the same configuration as that of the discharging path 12a shown in FIG. 5A. With such a modification, one terminal of the second switch SW2L is connected to a connection node that connects the first switch SW1b and the discharging resistor Rdisb. Furthermore, one terminal of the second switch SW2R is connected in the same manner.

With such a modification, the capacitor C3 is discharged via the discharging path 12a in the same way as in FIG. 5A. The output capacitor C2L is discharged via the second switch SW2L and the discharging resistor Rdisb. The output capacitor C2R is discharged via the second switch SW2R and the discharging resistor Rdisb.

Also, such modifications shown in FIGS. 5A and 5B provide the same advantages as those of the audio signal amplifier circuit 100 shown in FIG. 1.

It should be noted that, in FIG. 1 and FIG. 5B, the output terminal of the operational amplifier 14 is connected to the reference voltage source 20 via the single switch SW2. On the other hand, in FIG. 5A, the output terminal of the operational amplifier 14 is connected to the reference voltage source 20 via the two switches SW2 and SW1a. Thus, with such arrangements as shown in FIG. 1 and FIG. 5A, the difference in electric potential between the non-inverting input terminal (+) of the operational amplifier 14 and the output terminal thereof is smaller than that shown in FIG. 5B, which is advantageous from a noise suppression point of view.

[Second Embodiment]

Figure 7A:
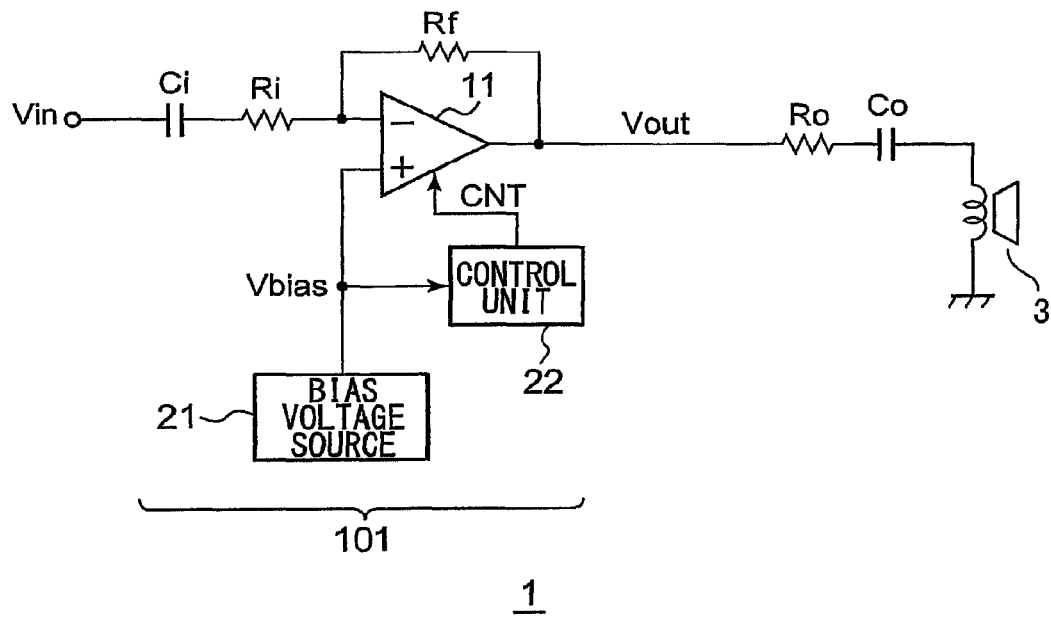
FIGS. 7A and 7B are circuit diagrams which each show a configuration of an inverting amplifier according to a second embodiment.
Figure 7B:
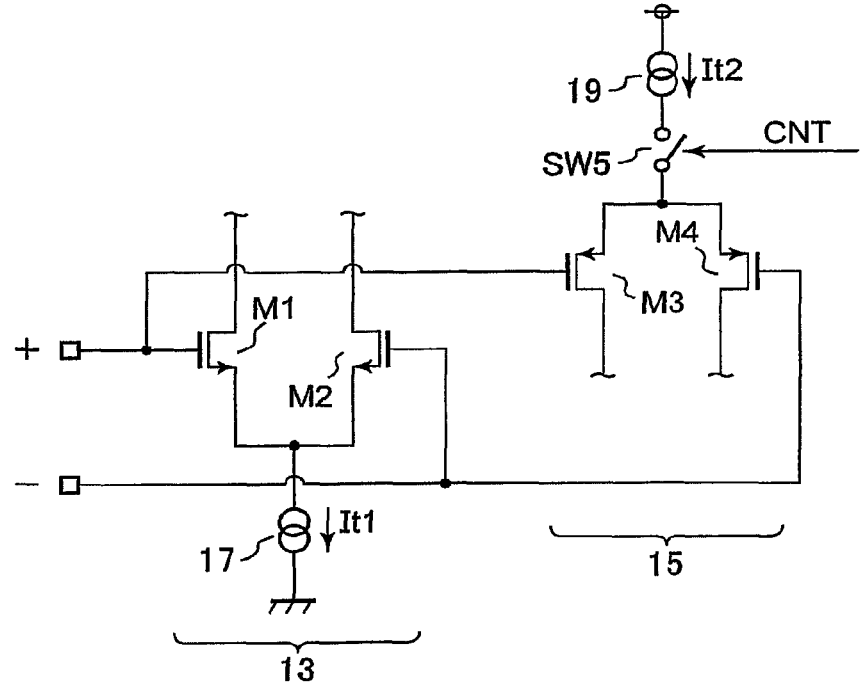

FIGS. 7A and 7B are circuit diagrams which show a configuration of an inverting amplifier 101 according to a second embodiment. FIG. 7A shows the overall configuration of the inverting amplifier 101.

The inverting amplifier 101 is mounted on an electronic device 1 having an audio playback function. The inverting amplifier 101 amplifies an audio signal (input signal Vin), and drives an electroacoustic transducer such as speakers, headphones, or the like, provided as a downstream component. The electroacoustic transducer 3 and the inverting amplifier 101 are coupled via an output resistor Ro and an output capacitor Co.

The inverting amplifier 101 includes an operational amplifier 11, a bias voltage source 21, a control unit 22, an input resistor Ri, a feedback resistor Rf, and an input capacitor Ci.

A bias voltage Vbias, which is generated by the bias voltage source 21, is input to the non-inverting input terminal (+) of the operational amplifier 11. In a case in which the input signal Vin is to be amplified, the bias voltage Vbias is set to approximately Vbmax=Vdd/2. The audio signal Vin is input to the inverting input terminal (−) of the operational amplifier 11 via the input capacitor Ci and the input resistor Ri. The feedback resistor Rf is arranged between the output terminal of the operational amplifier 11 and the inverting input terminal (−) thereof. The above configuration is the same as that shown in FIG. 6.

FIG. 7B is a circuit diagram which shows a configuration of an input stage of the operational amplifier 11. The operational amplifier 11 includes two input differential pairs 13 and 15, as in a typical rail-to-rail amplifier. That is to say, the first input differential pair 13 includes first conduction-type (N-channel) MOS transistors M1 and M2, and the second input differential pair 15 includes second conduction-type (P-channel) MOS transistors M3 and M4. The gate of the transistor M1 and the gate of the transistor M3 are connected to the non-inverting input terminal (+) of the operational amplifier 11. The gate of the transistor M2 and the gate of the transistor M4 are connected to the inverting input terminal (−) of the operational amplifier 11. Furthermore, the sources of the transistors M1 and M2 are connected so as to form a common source terminal, which is connected to a tail current source 17 configured to generate a tail current It1. The sources of the transistors M3 and M4 are connected so as to form a common source terminal, which is connected to a tail current source 19 configured to generate a tail current It2. With such an arrangement, a current-mirror load or a resistor load is connected to the drains of the transistors M1 through M4, and the differential amplification result is supplied to the output stage, which can be understood by those skilled in this art. Such a configuration according to the present invention is not restricted in particular.

The difference between the operational amplifier and a typical rail-to-rail amplifier is that the operational amplifier 11 has a configuration which allows one of the two input differential pairs 13 and 15 (i.e., the input differential pair 15) to be switched between the active state (ON) and the inactive state (OFF).

Description has been made in the present embodiment on the assumption that the operational amplifier is configured using a process wherein the threshold voltage Vthp of the P-channel MOSFET is greater than the threshold voltage Vthn of the N-channel MOSFET.

There is a further advantage to an arrangement made under the latter assumption, where the second input differential pair 15 formed of P-channel MOSFETs are switchable between the active state and the inactive state. The reason for this is that, in the inactive state of the second input differential pair 15, the input voltage Vin is amplified by the first input differential pair 13. With such an arrangement, each N-channel MOSFET has a low threshold voltage Vthn. Thus, in the inactive state, such an arrangement is capable of amplifying the input voltage Vin over a wide voltage range.

When the tail current It2 is supplied, the second input differential pair 15 is set to the active state. When the tail current It2 is cut off, the second input differential pair 15 is set to the inactive state. In order to switch the second input differential pair 15 between the active state and the inactive state, a cutoff transistor SW5 is arranged on the path for the tail current It2. The ON/OFF operation of the cutoff transistor SW5 is controlled according to a control signal CNT.

Returning to FIG. 7A, the control unit 22 generates the control signal CNT so as to control the switching of the second input differential pair 15 between the active state and the inactive state. Specifically, the control unit 22 monitors the voltage that corresponds to the bias voltage Vbias generated by the bias voltage source 21. In FIG. 7A, the voltage that corresponds to the bias voltage Vbias is the bias voltage Vbias itself. When the bias voltage Vbias is lower than a threshold voltage Vt, the control unit 22 sets the second input differential pair 15 to the active state, and when the bias voltage Vbias is higher than the threshold voltage Vt, the control unit 22 sets the second input differential pair 15 to the inactive state. The threshold voltage Vt is preferably set to a higher value than the threshold voltage Vthn of the N-channel MOSFET. With the present embodiment, the threshold voltage Vt is set to a voltage in the vicinity of the target value Vbmax set for the bias voltage Vbias.

Figure 8:
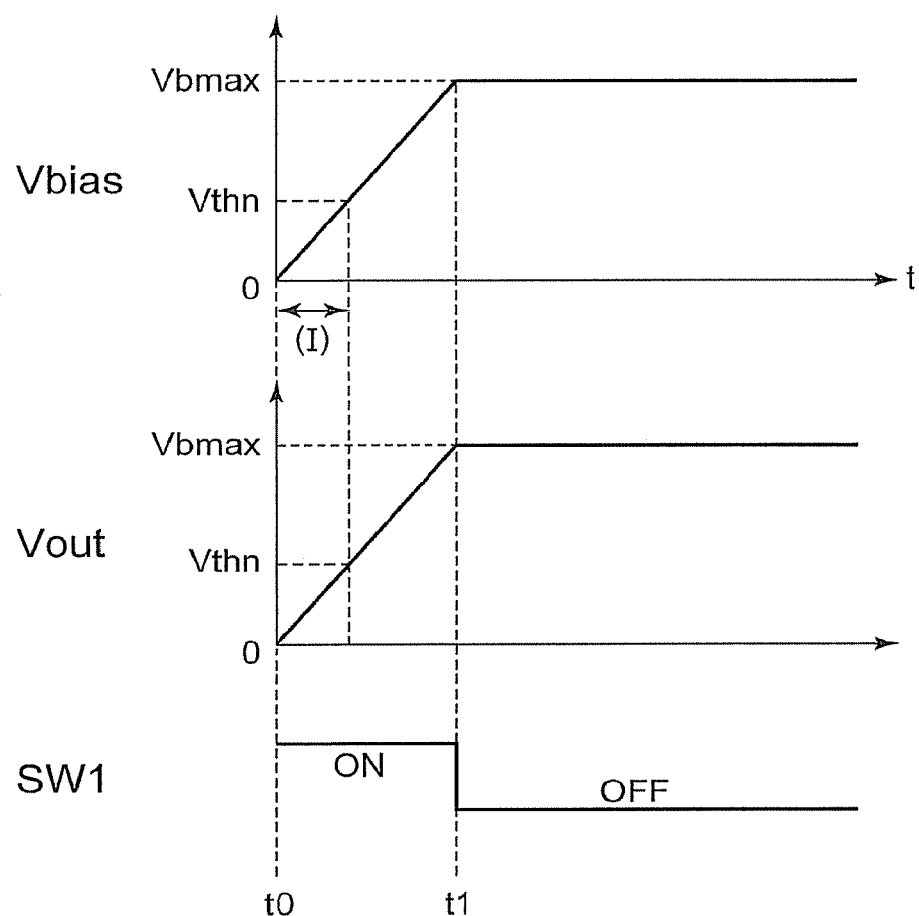
FIG. 8 is a time chart which shows the operation of the inverting amplifier shown in FIG. 7.

The above is the configuration of the inverting amplifier 101. Next, description will be made regarding the operation thereof. FIG. 8 is a time chart which shows the operation of the inverting amplifier 101 shown in FIG. 7. At the time point t0, the circuit is started up, and the bias voltage source 21 increases the bias voltage Vbias from 0 V toward the target value Vbmax. During the period from the time point t0 to the time point t1, Vbias is smaller than Vbmax, and accordingly, the cutoff transistor SW5 is ON. That is to say, the operational amplifier 11 shown in FIG. 7B operates as a rail-to-rail amplifier in which the pair of P-channel MOSFETs and the pair of N-channel MOSFETs are both in the active state. Thus, the output voltage Vout satisfactorily changes according to the bias voltage Vbias even in a range (I) where the bias voltage Vbias input to the non-inverting input terminal of the operational amplifier 11 is lower than Vth. That is to say, high linearity can be realized in such an arrangement.

When the bias voltage Vbias reaches Vbmax at the time point t1, the cutoff transistor SW5 is turned off. As a result, the second input differential pair 15 included in the operational amplifier 11 is switched to the inactive state, thereby reducing the circuit's current consumption. In this state, the input voltage range where the operational amplifier 11 can operate normally is from Vthn to (Vdd−Vsat). Here, Vsat represents the saturation voltage of the current source (P-channel MOSFET) connected to the power supply terminal of the operational amplifier 11.

In the audio signal playback mode of the inverting amplifier 101, i.e., after the time point t1, the electric potential at the non-inverting input terminal of the operational amplifier 11 is fixedly set to Vdd/2 (=Vbmax), and the electric potential at the inverting input terminal swings in a range of ±Va in the positive and negative directions with Vdd/2 as the midpoint. Here, Va represents the half-amplitude Va of the signal component of the audio signal Vin. Thus, the audio signal Vin can be amplified with distortion suppressed, as long as the following relations are satisfied.

$$Va<(Vdd/2-Vthn)$$

$$Va<(Vdd/2-Vsat)$$

The above is the operation of the inverting amplifier 101. As described above, the inverting amplifier 101 is capable of providing high linearity. Furthermore, such an arrangement reduces current consumption in the operation of amplifying an audio signal, as compared with the operation of the rail-to-rail amplifier.

Furthermore, the second input differential pair 15 shown in FIG. 7B is used only in the operation for starting up the bias voltage Vbias, and is not used to amplify the audio signal. With typical rail-to-rail amplifiers, there is a need to balance the current capacity between the first input differential pair 13 and the second input differential pair 15 in order to provide reduced distortion, leading to a problem of the second input differential pair 15 having a large circuit area. In contrast, with the present embodiment, the second input differential pair 15 is not used to amplify the audio signal. Thus, circuit design can be performed without the need to consider distortion. That is to say, the circuit can be designed such that the current capacity of the second input differential pair 15 is smaller than that of the first input differential pair 13. Thus, the size of the second input differential pair 15 can be reduced as compared with typical rail-to-rail amplifiers.

Figure 9:
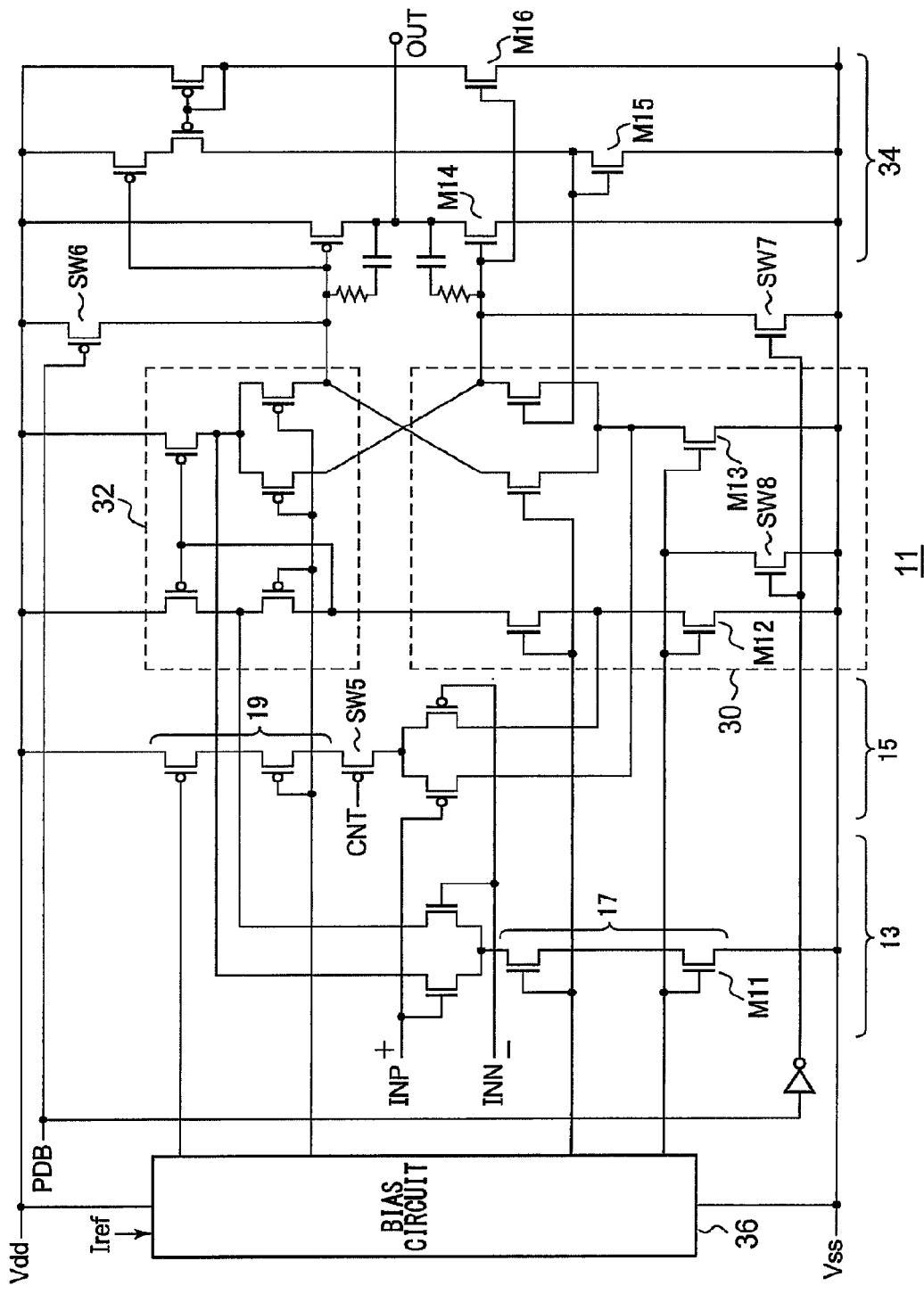
FIG. 9 is a circuit diagram which shows a detailed example configuration of the operational amplifier shown in FIG. 7B.

FIG. 9 is a circuit diagram which shows a more detailed example configuration of the operational amplifier shown in FIG. 7B. It should be noted that the configuration in FIG. 9 is shown for exemplary purpose only, and is by no means intended to restrict the present invention. The drains of the first input differential pair 13 and the second input differential pair 15 are respectively connected to cascode current mirror circuits 30 and 32 provided as loads. Furthermore, the sources of the first input differential pair 13 and the second input differential pair 15 are connected to the tail current sources 17 and 19, which each have a cascode current mirror configuration. The output signals of the cascode current mirror circuits 30 and 32 are input to a push-pull output stage 34. Switches SW6 through SW8 are provided in order to shut down the operational amplifier 11 according to a power down signal PDB. A bias circuit 36 receives a reference current Iref, and adjusts the bias state (gate voltage) of each transistor included in the operational amplifier 11.

Next, description will be made regarding a desired design method.

In recent years, reduction in the operating voltage (power supply voltage) of semiconductor integrated circuits is being earnestly pursued. In some cases, such semiconductor integrated circuits are required to operate at an operating voltage on the order of 1.5 V. In order to design such an operational amplifier which can operate with a low operating voltage, there is a need to lower the threshold voltage Vth of each MOSFET which is a component of the semiconductor integrated circuit. In order to lower the threshold voltage Vth, the following approaches can be conceived.

(1) Modifying the K parameter
(2) Increasing the carrier concentration

With the former approach, the threshold voltage can be lowered without involving an increase in a leak current that occurs at each transistor. However, there is a need to change the thickness of the oxide film or the like, which is a high hurdle to be overcome in the implementation. Here, the K parameter represents the slope of the voltage/current characteristics curve, with the gate voltage as the horizontal axis, and with the logarithm of the drain current as the vertical axis.

On the other hand, the latter approach can be realized by providing a layer formation step to the process as an additional step. However, such an arrangement in which the threshold voltage Vth is lowered leads to a problem of an increase in leak current. Here, leak current represents a current that flows through the channel of a transistor that is in the OFF state. Accordingly, such an approach for configuring an operational amplifier whereby the threshold voltage Vth of each MOSFET is lowered has a problem of an increase in current in the shutdown state.

In order to solve such a problem, of the transistors forming the operational amplifier 11, at least one of the MOSFETs connected in series between the power supply line (power supply terminal) and the ground line (ground terminal) is configured as a MOSFET having an ordinary threshold voltage (e.g., 0.7 V), and each of the other MOSFETs is configured as a MOSFET having a low threshold voltage (e.g., 0.4 V).

Description will be made regarding the operational amplifier 11 shown in FIG. 9 as an example. Transistors M11 through M16, which each have an ordinary threshold voltage Vth, are respectively provided to multiple current paths between the power supply line Vdd and the ground line Vss. Each of the other transistors has a low threshold voltage VthL.

Specifically, the transistor M11, which is a component of the tail current source for the first input differential pair 13, the transistor M12 and M13, which are included in the cascode current mirror circuit 30 configured as a load of the second input differential pair 15, and the transistor M14, M15, and M16 included in the push-pull output stage 34, each have the ordinary threshold voltage Vth.

Such a design method provides the operational amplifier 11 with a satisfactory input voltage range while allowing the operational amplifier 11 to operate with a low power supply voltage. Furthermore, with such a design method, the transistors are not all configured as transistors having a low threshold voltage VthL. Instead, at least one transistor on each path is configured as a transistor having an ordinary threshold voltage Vth. Thus, such an arrangement reduces the overall leak current that occurs at the circuit (current that flows in the shutdown state) even in a case of employing a process that provides transistors which each operate with a large leak current.

It should be noted that there is not a requirement to provide such a transistor having an ordinary threshold voltage Vth to all the paths. Also, such a transistor having an ordinary threshold voltage Vth may be arranged only on paths that have a large transistor size. Such an arrangement also reduces the leak current (shutdown current).

Description has been made above regarding an arrangement in which the N-channel MOSFET formed on the lowest electric potential side of each path is configured as a MOSFET having an ordinary threshold voltage. However, the present invention is not restricted to such an arrangement. Also, the P-channel MOSFET formed on the highest electric potential side of each path may be configured as a MOSFET having an ordinary threshold voltage Vth.

The application of this design method is not restricted to the operational amplifier 11 shown in FIG. 9. Rather, this design method can be widely applied to other kinds of operational amplifiers which are to operate at a low operating voltage. For example, the operational amplifier does not necessarily require a rail-to-rail configuration. Also, the operational amplifier may have a configuration having a single differential pair.

Figure 6A:
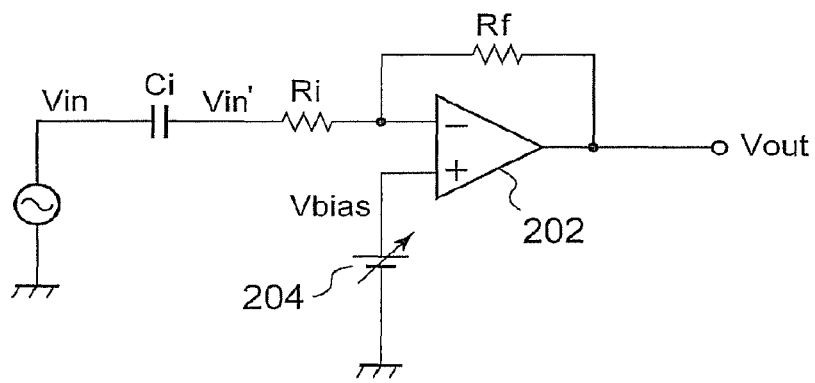
FIG. 6A is a circuit diagram which shows a configuration of a typical audio amplifier configured as an inverting amplifier.
Figure 6B:
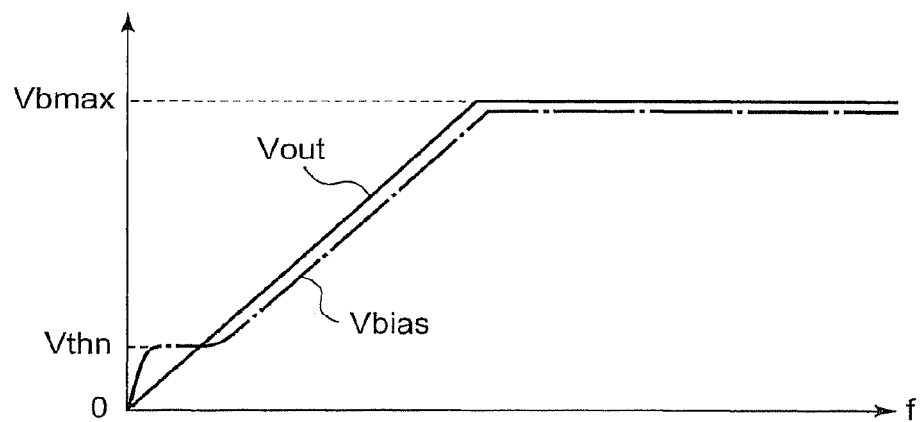
FIG. 6B is a time chart which shows the operation thereof.
Figure 10:
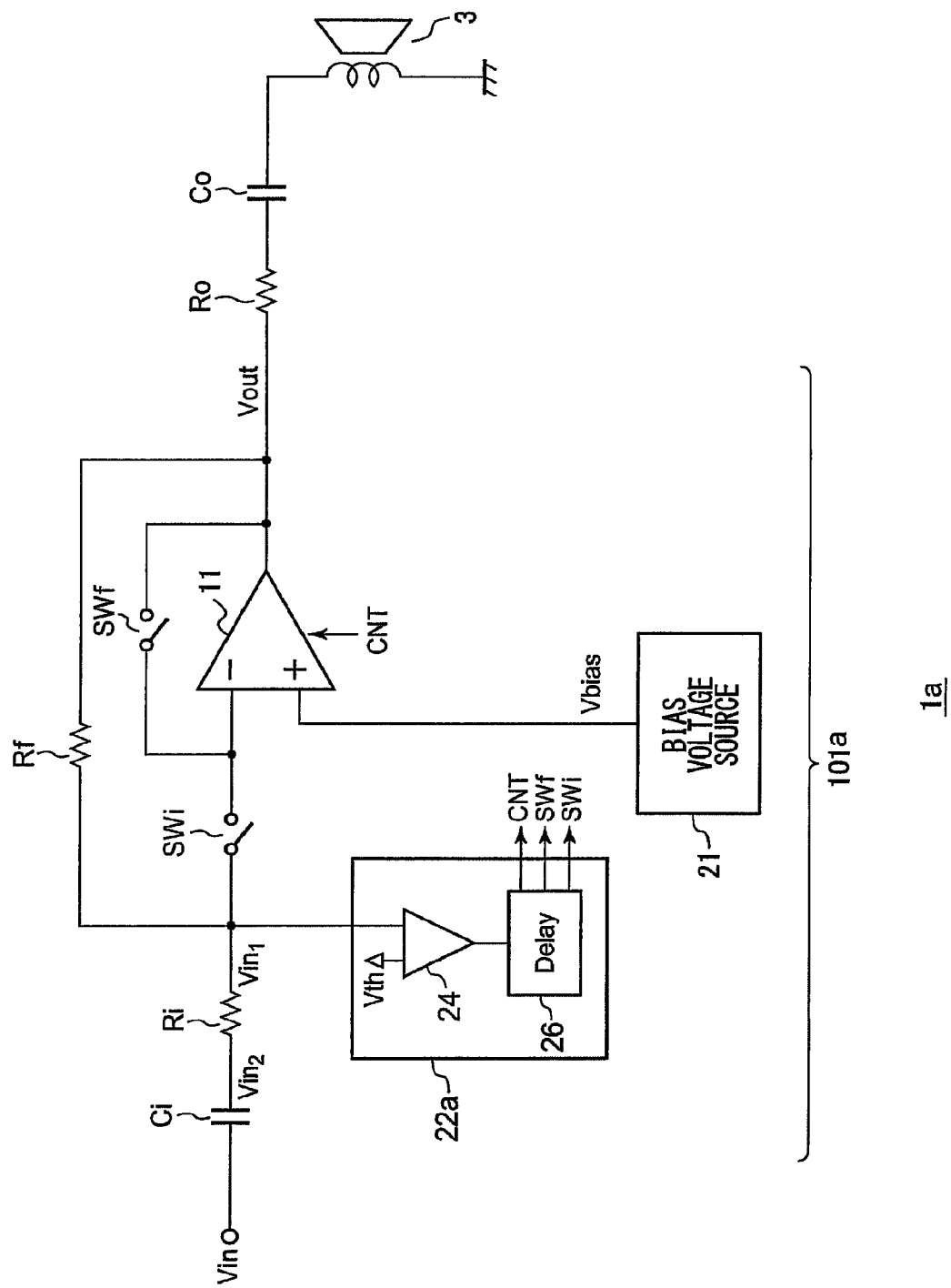
FIG. 10 is a circuit diagram which shows a circuit diagram which shows a configuration of an inverting amplifier according to a modification.

In the present specification, this design method can be applied to the operational amplifiers 14L and 14R shown in FIG. 1 and FIG. 3, the operational amplifier 202 shown in FIG. 6A, the operational amplifier 11 shown in FIG. 7A, the operational amplifier 11 shown in FIG. 9, and the operational amplifier 11 shown in FIG. 10.

The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention.

Description has been made in the embodiment regarding an arrangement in which the second input differential pair 15 is switched between the active state and the inactive state depending on detection of the bias voltage Vbias having reached the threshold voltage Vt (Vbmax). However, the present invention is not restricted to such an arrangement. For example, the threshold value Vt may be set to a desired voltage value which is higher than the threshold voltage Vthn of the N-channel MOSFET.

Also, instead of making a voltage comparison, the control unit 22 may set the second input differential pair 15 to the inactive state before a predetermined period of time τ elapses after the inverting amplifier 101 is started up (the power supply is turned on), and may set the second input differential pair 15 to the inactive state after the predetermined period of time τ elapses. With such an arrangement, the predetermined period of time τ should be set to be longer than the period of time required for the bias voltage Vbias to exceed the threshold voltage Vthn of the N-channel MOSFET.

FIG. 10 is a circuit diagram which shows a configuration of an inverting amplifier according to a modification.

Instead of the control unit 22 shown in FIG. 7A, an inverting amplifier 101a shown in FIG. 10 includes a control unit 22a. The control unit 22a monitors, as a voltage that corresponds to (is proportional to) the bias voltage Vbias, a voltage Vin1 at a connection node that connects an input resistor Ri and an input capacitor Ci, instead of the bias voltage Vbias itself.

Also, a voltage Vin2 at a connection node that connects the input resistor Ri and the input capacitor Ci may be monitored as a voltage that corresponds to the bias voltage Vbias. With another modification, the control unit may monitor the output voltage Vout as a voltage that corresponds to the bias voltage Vbias.

With such an arrangement, when the voltage Vin1 is lower than the predetermined threshold voltage Vt, the control unit 22a sets the second input differential pair 15 to the active state, and when the voltage Vin1 is higher than the threshold voltage Vt, the control unit 22a sets the second input differential pair 15 to the inactive state. The threshold voltage Vt is preferably set to a value higher than the threshold voltage Vthn of the N-channel MOSFET. For example, the threshold voltage Vt is set to a value that is slightly lower than the target value Vbmax set for the bias voltage Vbias.

Specifically, the control unit 22a includes comparator 24 and a delay circuit 26. The comparator 24 compares the voltage Vin1 with the threshold voltage Vth. The delay circuit 26 delays the output signal of the comparator 24 so as to generate a control signal CNT for the operational amplifier 11. It should be noted that the delay circuit 26 may be eliminated.

In the inverting amplifier 101a shown in FIG. 10, an imaginary short is set at the operational amplifier 11, and thus a feedback operation is performed such that the electric potential at the non-inverting input terminal of the operational amplifier 11 matches the electric potential at the inverting input terminal thereof. That is to say, when the bias voltage Vbias rises as the circuit is started up, the output voltage Vout of the operational amplifier 11 and the voltage at the non-inverting terminal thereof each rise according to the bias voltage Vbias. It should be noted that the change in the voltage Vin1 at the inverting input terminal is delayed with respect to the bias voltage Vbias by a time constant determined by means of the resistors Rf and Ri and the input capacitor Ci. That is to say, it can be understood that the voltage Vin1 at the input terminal is a voltage that corresponds to the bias voltage Vbias.

Thus, such an arrangement ensures that the bias voltage reaches the threshold voltage Vth at a timing at which the input voltage Vin1 reaches the certain threshold voltage Vth. Thus, with such a modification, the state of the second input differential pair 15 can be appropriately controlled in the same way as with the inverting amplifier 101 shown in FIG. 7A.

The inverting amplifier 101a shown in FIG. 10 further includes a feedback switch SWf and an input switch SWi. The feedback switch SWf is arranged between the output terminal of the operational amplifier 11 and the non-inverting input terminal of the operational amplifier 11. The input switch SWi is arranged between a connection node that connects the input resistor Ri and the feedback resistor Rf and the non-inverting input terminal of the operational amplifier 11.

Before the input voltage Vin1 reaches the threshold voltage Vth, the control unit 22a turns on the feedback switch SWf. After the input voltage Vin1 reaches the threshold voltage Vth, the control unit 22a turns off the feedback switch SWf. Furthermore, the control unit 22a switches the input switch SWi in a manner complementary to the feedback switch SWf.

With such an arrangement including the feedback switch SWf, by turning on the feedback switch SWf during the period until the input voltage Vin1 reaches the threshold voltage Vth, the operational amplifier 11 functions as a voltage follower. That is to say, the output voltage Vout can be gradually raised according to the bias voltage Vbias. This provides a mute state while suppressing the occurrence of noise. Furthermore, the input switch SWi is OFF during this period. Thus, the input voltage Vin and the noise that occurs due to the charging operation for the input capacitor Ci are not input to the operational amplifier, thereby suppressing noise.

Also, the control operation for the input switch SWi and the feedback switch SWf may be performed synchronously with the control operation for the differential pairs included in the operational amplifier 11. Such an arrangement provides a simple circuit configuration.

It should be noted that the input switch SWi may be eliminated from the circuit configuration shown in FIG. 10. Furthermore, the feedback switch SWf can be eliminated.

Description has been made in the embodiment regarding the inverting amplifier 101 configured to amplify an audio signal. However, the signal to be amplified is not restricted to such an audio signal. Also, the present invention can be effectively employed in other applications.

While the preferred embodiments of the present invention have been described using specific terms, such description is for illustrative purposes only, and it is to be understood that changes and variations may be made without departing from the spirit or scope of the appended claims.

What is claimed is:

1. An inverting amplifier comprising:
an operational amplifier which comprises a first input differential pair including first conduction-type MOSFETs (Metal Oxide Semiconductor Field Effect Transistors) and a second input differential pair including second conduction-type MOSFETs;
an input resistor arranged such that one terminal thereof is connected to an inverting input terminal of the operational amplifier, and an input signal to be amplified is received via the other terminal thereof;
a feedback resistor arranged between the inverting input terminal of the operational amplifier and an output terminal thereof;
a bias voltage source configured to generate a bias voltage, and to supply the bias voltage thus generated to a non-inverting input terminal of the operational amplifier; and
a control unit configured to switch the second input differential pair between an active state and an inactive state according to the bias voltage, wherein, when a voltage that corresponds to the bias voltage is lower than a predetermined threshold value, the control unit sets the second input differential pair to the active state, and when the voltage that corresponds to the bias voltage is higher than the threshold value, the control unit sets the second differential pair to the inactive state.

2. An inverting amplifier according to claim 1, wherein the control unit monitors the voltage at the output terminal of the bias voltage source as the voltage that corresponds to the bias voltage.

3. An inverting amplifier according to claim 1, wherein the control unit monitors, as the voltage that corresponds to the bias voltage, the voltage at a connection node that connects the input resistor and the feedback resistor.

4. An inverting amplifier according to claim 1 wherein the control unit switches the second input differential pair between the active state and the inactive state by controlling the supply of a tail current to the second input differential pair.

5. An inverting amplifier according to claim 4, further comprising a cutoff transistor arranged on a path for the tail current to be supplied to the second input differential pair,
wherein the control unit is configured to switch the cutoff transistor between the ON state and the OFF state.

6. An electronic device comprising:
an electroacoustic transducer; and
an inverting amplifier according to claim 1, configured to amplify an audio signal, and to drive the electroacoustic transducer.

7. An inverting amplifier comprising:
an operational amplifier which comprises a first input differential pair including first conduction-type MOSFETs (Metal Oxide Semiconductor Field Effect Transistors) and a second input differential pair including second conduction-type MOSFETs;
an input resistor arranged such that one terminal thereof is connected to an inverting input terminal of the operational amplifier, and an input signal to be amplified is received via the other terminal thereof;
a feedback resistor arranged between the inverting input terminal of the operational amplifier and an output terminal thereof;
a bias voltage source configured to generate a bias voltage, and to supply the bias voltage thus generated to a non-inverting input terminal of the operational amplifier; and
a control unit configured to switch the second input differential pair between an active state and an inactive state according to the bias voltage,
wherein the first input differential pair is formed of N-channel MOSFETs,
and wherein the second conduction-type MOSFET is configured as a P-channel MOSFET, and wherein the threshold voltage of the P-channel MOSFET is greater than the threshold voltage of the N-channel MOSFET.

8. An electronic device comprising:
an electroacoustic transducer; and
an inverting amplifier according to claim 7, configured to amplify an audio signal, and to drive the electroacoustic transducer.

9. An inverting amplifier comprising:
an operational amplifier which comprises a first input differential pair including first conduction-type MOSFETs (Metal Oxide Semiconductor Field Effect Transistors) and a second input differential pair including second conduction-type MOSFETs;
an input resistor arranged such that one terminal thereof is connected to an inverting input terminal of the operational amplifier, and an input signal to be amplified is received via the other terminal thereof;
a feedback resistor arranged between the inverting input terminal of the operational amplifier and an output terminal thereof,
a bias voltage source configured to generate a bias voltage, and to supply the bias voltage thus generated to a non-inverting input terminal of the operational amplifier; and
a control unit configured to switch the second input differential pair between an active state and an inactive state according to the bias voltage,
wherein the current capacity of the second input differential pair is lower than the current capacity of the first input differential pair.

10. An electronic device comprising:
an electroacoustic transducer; and
an inverting amplifier according to claim 9, configured to amplify an audio signal, and to drive the electroacoustic transducer.

11. An inverting amplifier comprising:
an operational amplifier which comprises a first input differential pair including first conduction-type MOSFETs (Metal Oxide Semiconductor Field Effect Transistors) and a second input differential pair including second conduction-type MOSFETs;
an input resistor arranged such that one terminal thereof is connected to an inverting input terminal of the operational amplifier, and an input signal to be amplified is received via the other terminal thereof;
a feedback resistor arranged between the inverting input terminal of the operational amplifier and an output terminal thereof;
a bias voltage source configured to generate a bias voltage, and to supply the bias voltage thus generated to a non-inverting input terminal of the operational amplifier; and
a control unit configured to switch the second input differential pair between an active state and an inactive state according to the bias voltage,
wherein at least one MOSFET from among the MOSFETs arranged in series between a power supply line and a ground line of the operational amplifier so as to form a current path is configured as a MOSFET having an ordinary threshold voltage, and each of the other transistors is configured as a MOSFET having a low threshold voltage.

* * * * *